United States Patent [19]
Ohira et al.

[11] Patent Number: 5,976,973
[45] Date of Patent: Nov. 2, 1999

[54] METHOD OF MAKING A SEMICONDUCTOR DEVICE HAVING PLANARIZED INSULATING LAYER

[75] Inventors: Koichiro Ohira; Katsuyuki Karakawa; Kazutoshi Izumi; Masahiko Doki, all of Kawasaki, Japan

[73] Assignee: Fujitsu Ltd., Kanagawa, Japan

[21] Appl. No.: 08/948,329

[22] Filed: Oct. 10, 1997

[30] Foreign Application Priority Data

Nov. 25, 1996 [JP] Japan ................................. 8-314038

[51] Int. Cl.$^6$ .................................................. H01L 21/30
[52] U.S. Cl. ..................... 438/645; 438/669; 438/636; 438/695; 438/692; 438/782; 438/906; 438/761
[58] Field of Search ................................. 438/645, 906, 438/782, 691, 692, 695, 761, 669, 636

[56] References Cited

U.S. PATENT DOCUMENTS

| | | | |
|---|---|---|---|
| 4,770,899 | 9/1988 | Zeller | 427/96 |
| 5,630,904 | 5/1997 | Aoyama et al. | 438/669 |
| 5,744,402 | 4/1998 | Fukazawa et al. | 438/734 |
| 5,759,973 | 6/1998 | Honda et al. | 134/2 |
| 5,849,639 | 12/1998 | Molloy et al. | 438/714 |

FOREIGN PATENT DOCUMENTS 07201794   8/1995   Japan .

OTHER PUBLICATIONS

Wolf, Stanley, Silicon Processing for the VLSI ERA, vol. 2, pp. 237–238, 1990.

Primary Examiner—Chandra Chaudhari
Assistant Examiner—Thanh Nguyen
Attorney, Agent, or Firm—Armstrong, Westerman, Hattori, McLeland and Naughton

[57] ABSTRACT

A method of manufacturing a semiconductor device has the steps of: forming a wiring pattern by dry etching a wiring layer on a semiconductor substrate, using a resist pattern as a mask; immersing the wiring pattern in amine containing liquid to remove deposition residues formed during the dry etching; then, processing the wiring pattern with fluid not containing amine and being capable of removing deposition residues; forming a conformal insulating layer on the processed wiring pattern; and forming an insulating layer having a planarizing function on the conformal insulating layer by CVD. This method is suitable for multi-layer wiring, and can form an interlayer insulating film having a satisfactory planarizing function.

22 Claims, 4 Drawing Sheets

5,976,973

METHOD OF MAKING A SEMICONDUCTOR DEVICE HAVING PLANARIZED INSULATING LAYER

This application is based on Japanese patent application Hei 8-314038, filed on Nov. 25, 1996, the all contents of which are incorporated herein by reference.

BACKGROUND OF THE INVENTION a) Field of the Invention

The present invention relates to a method for manufacturing semiconductor devices, and more particularly to a method of making a semiconductor device adapted for semiconductor devices with multi-layer wiring.

b) Description of the Related Art

Multi-layer wiring techniques are essential for highly integrated semiconductor devices. It is necessary to electrically insulate wiring layers by an interlayer insulating film. As a lower level wiring pattern is formed, the pattern has inevitably irregular upper surfaces. If the interlayer insulating film is formed conformal to the topology of the underlying layer, similar irregular surfaces are formed on the interlayer insulating film. Some problems of photolithography or patterning a wiring layer occur if an upper level wiring layer is formed on the irregular surfaces of the underlying layer. Therefore, after the lower level wiring pattern is formed, it is desired that recesses between wiring patterns are filled with planarizing material to form an interlayer insulating film having a flat surface.

Various techniques of forming an insulating film having a planarizing function have been developed. However, an insulating film having a planarizing function has generally the tendency that it is inferior to a dense insulating film conformal to the topology of an underlying layer in terms of passivation performance such as water-proof. It is therefore usual that a plurality type of insulating films are stacked to form an interlayer insulating film having a flat surface. One example of such a lamination film will be described.

In patterning a lower level wiring layer, dry etching is generally performed by using a resist pattern as a mask. In dry etching, an unnecessary portion of a wiring layer is fluoridized or chloridized to gasify and remove it, while reaction products are being deposited on the side wall of an etched wiring pattern. These reaction products deposited during etching remain on the side wall of the wiring pattern and on the surface of an insulating film, and become deposition residues. These deposition residues become one of the causes of short circuits between wiring patterns and of defective semiconductor devices. In order to remove such deposition residues, wet etching has been used.

After wet etching, a dense film such as a plasma oxide film which is excellent in passivation performance is formed on the surface of the patterned wiring layer. Such a dense film is deposited conformal to the surface of the underlying layer and has irregular upper surfaces. In order to planarize the irregular surfaces, an insulating film having a planarizing function is formed on the dense film by atmospheric pressure CVD.

If wet etching using organic amine containing liquid is performed so as to remove deposition residues, short circuits and the like to be caused by deposition residues can be prevented. However, the surface topology of the insulating film having the planarizing function and formed through atmospheric pressure CVD is considerably degraded, and even if the insulating film having the planarizing function is formed, a sufficiently planarized surface cannot be formed.

SUMMARY OF THE INVENTION

It is an object of the present invention to provide a method of manufacturing a semiconductor device capable of forming an interlayer insulating film which has a sufficient planarizing function while preventing short circuits and the like to be caused by deposition residues.

It is another object of the present invention to provide a method of manufacturing a semiconductor device capable of forming an interlayer insulating film which has a sufficient planarizing function, while removing deposition residues with amine containing liquid.

According to one aspect of the present invention, there is provided a method of manufacturing a semiconductor device comprising the steps of: forming a wiring layer on a semiconductor substrate; forming a wiring pattern by dry etching the wiring layer using a resist pattern as a mask; immersing the wiring pattern in amine containing liquid to remove deposition residues formed during the dry etching; processing the wiring pattern having immersed in the amine containing liquid with fluid not containing amine and being capable of removing deposition residues; forming a conformal insulating layer on the processed wiring pattern; and forming an insulating layer having a planarizing function on the conformal insulating layer by CVD.

After the surface of wiring patterns is washed with amine containing liquid, it is further processed with fluid not containing amine capable of removing deposition residues. It is therefore possible to satisfactorily planarize the surface of an insulating layer having the planarizing function formed on a conformal insulating layer.

Even if a process of removing deposition residues with amine containing liquid is performed, it is possible to form an interlayer insulating film having a sufficiently flat surface. Semiconductor devices with multi-layer wiring patterns can therefore be manufactured efficiently.

DETAILED DESCRIPTION OF THE PREFERRED EMBODIMENTS

Embodiments of the invention will be described with reference to the accompanying drawings.

As an example of manufacture processes for highly integrated semiconductor devices, manufacture processes for dynamic random access memories (DRAMs) will be described with reference to FIGS. 3A–3C.

Figure 3A:
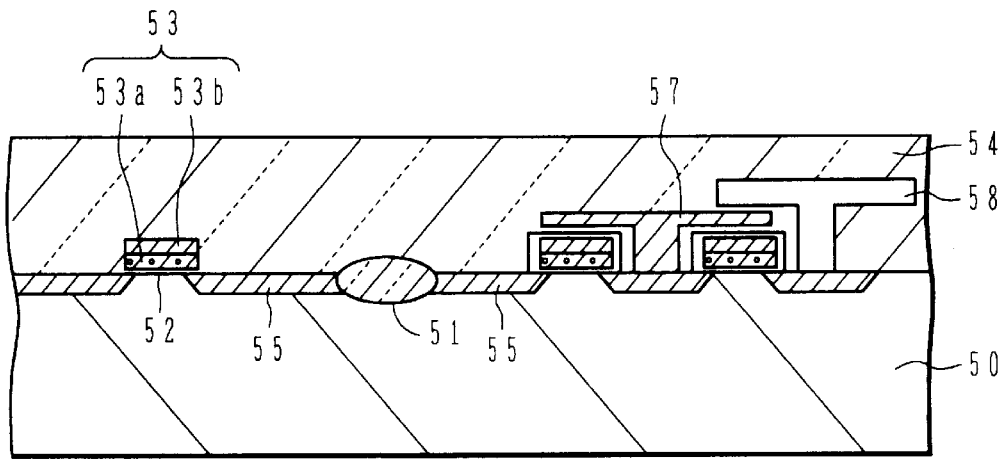
FIGS. 3A–3C are cross sectional views illustrating manufacture processes for DRAMs.

As shown in FIG. 3A, on the surface of a semiconductor substrate 50, a field oxide film 51 is formed by well known LOCOS technique. Active regions are defined being surrounded with the field oxide film 51.

A gate oxide film 52 is formed on the surface of an active region through thermal oxidation. A polysilicon layer 53a and a silicide layer 53b are formed on the gate oxide film 52 and patterned to form a gate electrode 53. After the gate electrode 53 is formed, ions are implanted to form source/drain regions 55 by using as a mask the gate electrode 53 and field oxide film 51. Thereafter, a desired number of processes, such as an insulating film forming process, a contact hole opening process through photolithography, a conductive layer forming process, and a patterning process through photolithography, are executed to form a structure having a bit line 57 and a capacitor 58 embedded in an insulating layer 54. The capacitor 58 may be of a well known fin-type structure having an insulating film such as a silicon oxide film, and a polysilicon layer.

Figure 3B:
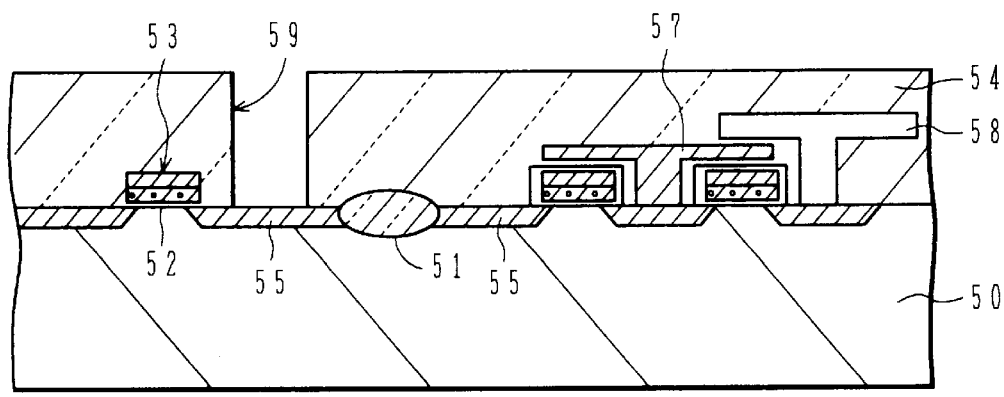

As shown in FIG. 3B, a contact hole 59 is formed in the insulating film 54 through etching after a resist pattern (not shown) is formed on the surface of the insulating layer 54. The contact hole 59 is used for a wiring pattern to be connected to one of the source/drain regions of a MOS transistor.

Figure 3C:
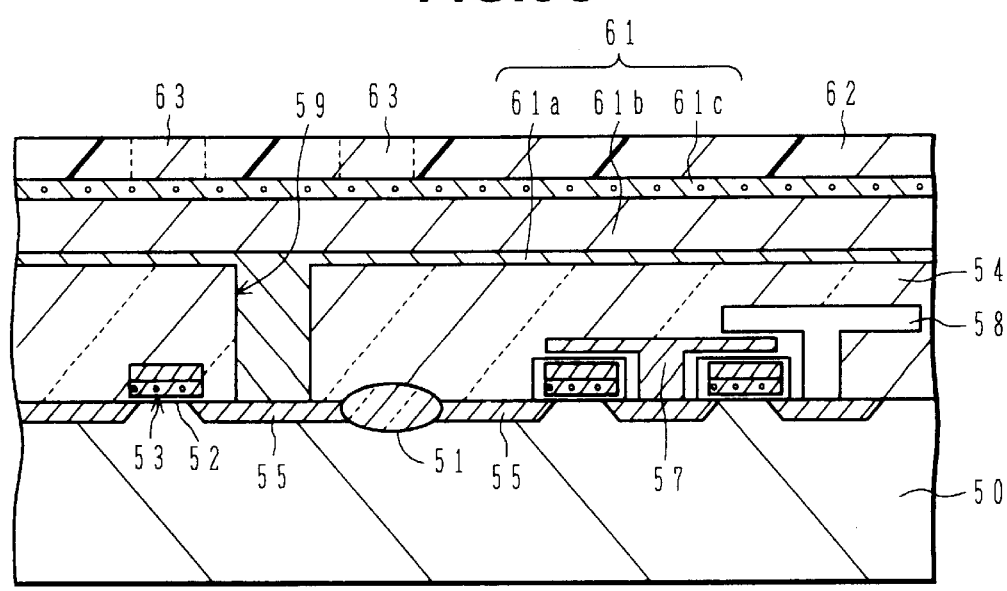

As shown in FIG. 3C, a wiring layer 61 is formed on the substrate provided with the contact hole, and a resist film 62 is deposited on the wiring layer 61. For example, the wiring layer 61 comprises a barrier metal layer 61a, a main wiring layer 61b, and an antireflection layer 61c.

The resist film 62 is selectively exposed to form an exposed region 63. The exposed region 63 is removed through development, and the wiring layer 61 is etched by using the remaining resist pattern 62 as a mask.

Although the wiring layer 61 is electrically connected to the source/drain region 55 before the termination of etching, the wiring layer 31 becomes to include, after the termination of etching, a region electrically connected to the source/drain region 55 and a region formed on the insulating film and electrically isolated from the substrate.

In the following description, it is assumed that a semiconductor substrate has already formed with the semiconductor device structure as shown in FIG. 3C. In order to simplify the drawings, the semiconductor device structure is omitted in the drawings.

Figure 1A:
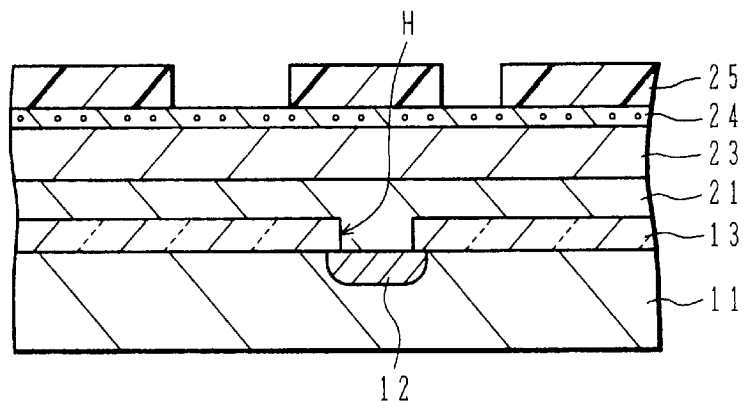
FIGS. 1A–1F are cross sectional views illustrating a method of manufacturing a semiconductor device according to an embodiment of the invention.

Referring to FIG. 1A, a semiconductor substrate 11 with an impurity doped region 12 has an insulating layer 13 formed on the surface thereof. Although this insulating layer 13 is drawn as one unit, it may include a field oxide film formed through thermal oxidation, an oxide film and the like deposited over the substrate surface. The doped region 12 is a source/drain region of a MOS transistor. The insulating layer 13 has a contact hole formed therein for exposing the diffused region 12.

On the surface of this substrate, a barrier metal layer 21, a main wiring layer 23, and an antireflection layer 24 are deposited in this order. For example, the barrier metal layer 21 is made of a TiN single layer or a lamination structure of a Ti layer and a TiN layer stacked on the Ti layer. The main wiring layer 23 is formed, for example, of a W layer, an Al—Cu (0.5%) alloy layer, an Al—Cu(0.5%)—Si alloy layer, a lamination structure of a Cu layer and a TiN layer stacked on the Cu layer. The antireflection film 24 may be an amorphous carbon film, an amorphous silicon film, an amorphous silicon oxynitride film, a TiN film, a WN film, a TiWN film, a $Ta_2O_5$ film, or a Ta film. The barrier metal layer, main wiring layer, and antireflection layer may be formed by sputtering. The antireflection film 24 reduces an amount of light reflected during photolithography, and may be omitted in some cases.

On the surface of this substrate provided with the laminated wiring layer, a photoresist layer is coated, exposed, and developed to form a resist pattern 25.

Figure 1B:
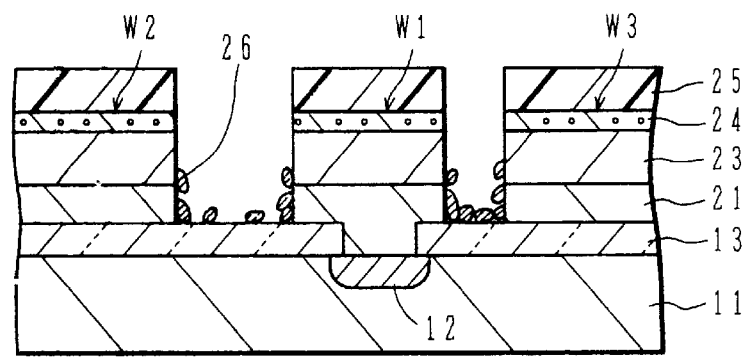

As shown in FIG. 1B, by using the resist pattern 25 as a mask, the antireflection film 24, main wiring layer 23, and barrier metal layer 21 are dry etched. For this dry etching, etchant gas which contains Cl or F for example is used. The patterned wiring layer has a substrate-contacted wiring pattern W1 electrically connected via the contact hole H to the substrate 11 and electrically isolated wiring patterns W2 and W3 on the insulating film 13.

During the dry etching, deposition residues 26 are produced and adhered to the side walls of the etched wiring patterns and on the surface of the insulating layer 13.

Figure 1C:
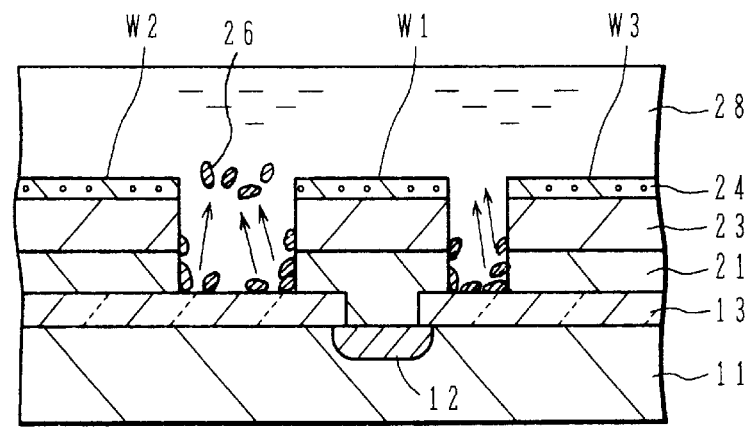

If an interlayer insulating film is formed on the substrate with such deposition residues after the resist pattern 25 is removed, short circuits between wiring patterns or the like may occur as described earlier. In this embodiment, as shown in FIG. 1C, the surface of the wiring patterns, from which the resist pattern 25 has been removed, is brought into contact with organic amine containing liquid 28 to remove the deposition residues 26. The organic amine includes primary amine. It is expected that the deposition residues 26 are desorbed or detached from the surface of the insulating film 13 and from the side walls of the wiring patterns.

In place of liquid which contains primary amine, liquid which contains secondary or tertiary amine may be used for removing deposition residues. For example, $CH_3NH_2$, $(CH_3)_2NH$, and $(CH_3)_3N$ may be used respectively as primary, secondary, and tertiary amine.

Figure 1D:
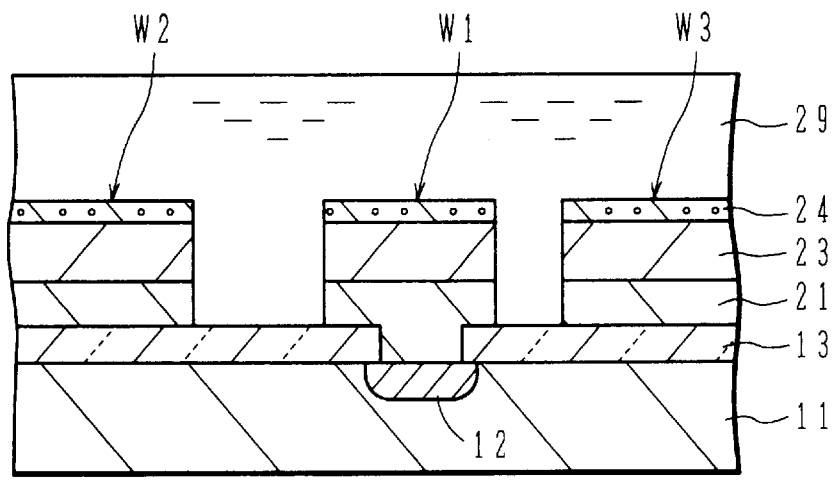

As shown in FIG. 1D, the surface of the wiring patterns processed with organic amine containing liquid is immersed into liquid 29 which contains ammonium fluoride by 5 wt %. The concentration of ammonium fluoride is sufficient if it is in the range from 0.1 wt % to 50 wt %. As a substitute for ammonium fluoride, hydrogen fluoride containing liquid in the range from 0.1 wt % to 50 wt %, for example 5 wt %, may be used. Source gas which contains hydrogen fluoride in the range from 80 wt % to 100 wt % may be used.

Figure 1E:
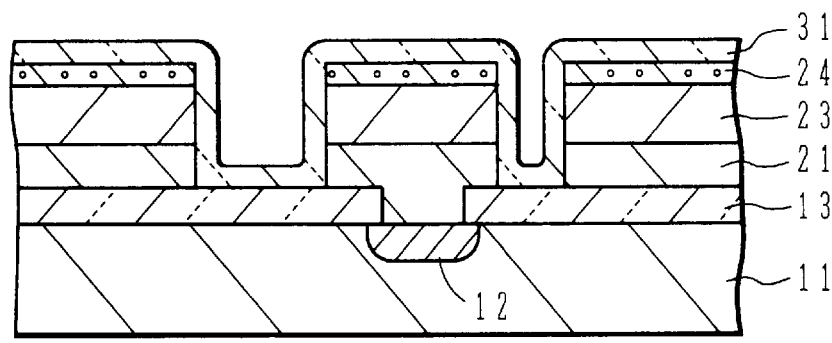

As shown in FIG. 1E, on the surface of the substrate subjected to the above wet etching or washing process, a conformal insulating film 31 having high passivation performance is formed. This conformal insulating film 31 may be formed by using a diode parallel plate plasma CVD system, an inductively coupled plasma CVD system, an electron cyclotron resonance (ECR) plasma CVD system, an atmospheric pressure CVD system or the like. For example, a conformal insulating film 31 comprising silicon oxide is formed by the diode parallel plate plasma CVD system. In the case of the diode parallel plasma CVD system, the two electrode plates may be applied with RF power of a single frequency or two frequencies.

In forming the conformal insulating film, first and second source gases are preferably used. The first source gas may be one or a combination of two to five materials selected from the group consisting of $SiH_4$, $Si_2H_6$, $Si(OC—R)_4$, $HSi(OC—R)_3$, $SiF_4$, $SiH_2F_2$, $C_2F_6$, $FSi(OC—R)_3$, $F_2Si(OC—R)_2$, $R—PH_2$, $R_2—PH$, $B_2H_6$, $P(O—R)_3$, $PO(O—R)_3R_3—B$, $R_2—BH$, $R—BH_2$, $B(O—R)_3$, $BF_3$, $FB(O—R)_2$, $F_2B(O—R)$, where R is alcoxyl. The second source gas may be one or a combination of two to five materials selected from the group consisting of $N_2O$, $O_2$, $O_3$, O, $F_2$, $NH_3$, rare gases, and $N_2$.

The conformal insulating layer 31 has a function of a passivation film for the wiring layer and serves as an underlying layer on which the insulating film having the planarizing function is formed. In order to satisfy both the functions, it is preferable to form the conformal insulating film 31 of a lamination structure of first and second layers which independently take charge of each of the two functions.

For example, the first layer is 100 nm thick and has the compositions of Si 33.67 at %, O 59.26 at %, N 4.04 at %, and H 3.03 at %, and the second layer is 30 nm thick and has the compositions of Si 33.65 at %, O 30.28 at %, N 23.98 at %, and H 12.69 at %.

The compositions of the first and second layers of the conformal insulating layer 31 are not limited to the above-described compositions. For example, the compositions of the first layer may contain Si 25 at %–45 at %, O 30 at %–65 at %, N 0 at %–25 at %, H 0.01 at %–25 at %, Ar 0.001 at %–3 at %, F 0.001 at %–25 at %, B 0.001 at %–10 at %, P 0.001 at %–10 at %, and C 0.001 at %–50 at %.

The compositions of the second layer may contain Si 25 at %–35 at %, O 45 at %–70 at %, N 0.0001 at %–3.0 at %, H 0.0001 at %–5 at %, Ar 0.0001 at %–3 at %, F 0.0001 at %–15 at %, P 0.0001 at %–10 at %, and C 0.0001 at %–2 at %.

Alternatively, the compositions of the second layer may contain Si 45 at %–55 at %, O 5 at %–25 at %, N 15 at %–30 at %, H 10.0 at %–25 at %, Ar 0.0001 at %–3 at %, F 0.0001 at %–15 at %, P 0.0001 at %–10 at %, and C 0.0001 at %–2 at %.

It is preferable that the first layer is 10 nm or thicker and the second layer is 5 nm or thicker.

The first layer of the two-layer structure of the conformal insulating layer 31 is formed so that it is denser and becomes more excellent in the passivation performance than the second layer, and the second layer has a performance more excellent than the first layer as the underlying layer of an insulating film having the planarizing function. This performance of the second layer includes planarization, step coverage, surface smoothing, growth speed stability, and the like respectively of an overlying layer. For example, a film having such performance superior to a thermal silicon oxide film, or more preferably to a plasma silicon nitride film, is used as the second layer.

Figure 1F:
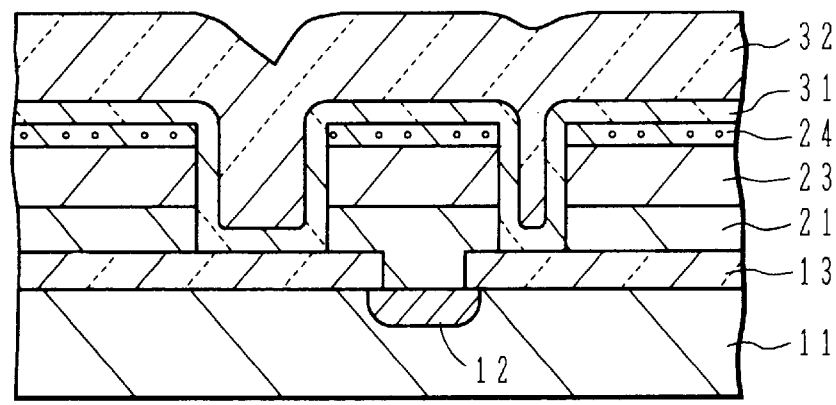

As shown in FIG. 1F, on the conformal insulating layer 31, an insulating film 32 is formed through atmospheric pressure CVD, having a planarizing function and containing as its main components $SiO_2$. For example, this CVD is performed by supplying Si containing liquid source having alcoxyl, such as tetraethoxysilane (TEOS) and carried on inert carrier gas to the substrate heated to 300° C. or higher in $O_2$ atmosphere containing $O_3$ at 0.1 wt %–10 wt %. The liquid source which contains alcoxyl may be TMS[HSi$(OCH_3)_3$], TRIES[HSi$(OC_2H_5)_3$], TEOS[Si$(OC_2H_5)_4$], TMB[B$(OCH_3)_3$], TEB[B$(OC_2H_5)_3$], TEFS[FSi$(OC_2H_5)_3$], TMP[P$(OCH_3)_3$], TMOP[PO$(OCH_3)_3$], TEOP[PO$(OC_2H_5)_3$] or the like. The source gas for the insulating film 32 having the planarizing function may be a combination of materials selected from TEOS/$O_3$/$O_2$/$N_2$, TMS/$O_3$/$O_2$/$N_2$, TRIES/$O_3$/$O_2$/$N_2$, TEOS/TMS/$O_3$/$O_2$/$N_2$, TEOS/TRIES/$O_3$/$O_2$/$N_2$, TEOS/TEFS/$O_3$/$O_2$/$N_2$ and $SiH_4$/$O_2$/$N_2$.

For example, an insulating film of 400 nm–800 nm having the planarizing function is formed through atmospheric pressure CVD by supplying TEOS carried on inert carrier gas to the substrate heated to 350° C.–450° C. in $O_2$ atmosphere containing $O_3$ at 4 wt %–6 wt %. The compositions of this insulating film 32 are Si 32.45 at %, O 62.88 at %, N 3.22 at %, and H 4.87 at %.

The compositions of the insulating film 32 are not limited to the above-described compositions. For example, the compositions of the insulating film 32 having the planarizing function may contain Si 25 at %–45 at %, O 30 at %–65 at %, N 0.001 at %–25 at %, H 0.001 at %–25 at %, Ar 0.001 at %–3 at %, F 0.001 at %–25 at %, B 0.001 at %–10 at %, P 0.001 at %–10 at %, and C 0.001 at %–50 at %.

Of the source gases for the insulating film 32 having the planarizing function, the first source gas may be one or a combination of two or three materials selected from the group consisting of $SiH_4$, $Si_2H_6$, Si(OC—R)$_4$, HSi(OC—R)$_3$, $SiF_4$, $SiH_2F_2$, $C_2F_6$, FSi(OC—R)$_3$, $F_2$Si(OC—R)$_2$, R—PH$_2$, R$_2$—PH, $B_2H_6$, P(O—R)$_3$, PO(O—R)$_3$R$_3$—B, R$_2$—BH, R—BH$_2$, B(O—R)$_3$, BF$_3$, FB(O—R)$_2$, $F_2$B(O—R), where R is alcoxyl. The second source gas may be one or a combination of two or three materials selected from the group consisting of $O_2$, $O_3$, O, rare gases, and $N_2$.

As show in FIG. 1F, although the surface of the insulating film 32 has some dents at the recess portions between the wiring patterns, it is far more planarized as compared to the topology of the conformal insulating layer 31. In the above manner, even when deposition residues are removed with organic amine containing liquid, when the surface of the substrate is then processed with ammonium or hydrogen fluoride liquid, a planarized interlayer insulating film can be deposited which exhibits satisfactorily its intrinsic planarizing function.

After the process shown in FIG. 1F is performed, a contact hole is formed in the interlayer insulating film to expose the surface of the underlying wiring pattern, and an overlying wiring pattern is formed. If necessary, a desired number of interlayer insulating films and wiring layers are alternately formed.

In order to help understanding of the present invention, a comparison example will be described below.

Figure 2A:
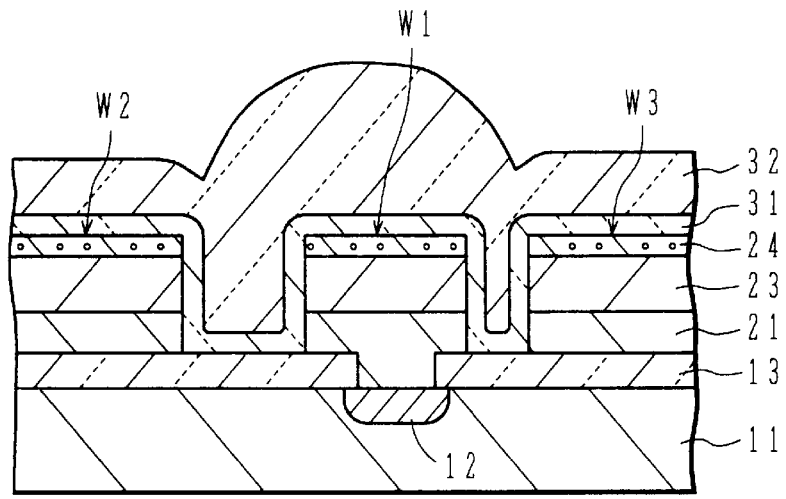
FIGS. 2A–2C are cross sectional views illustrating a comparison example which helps understanding of the present invention.

FIG. 2A is a schematic diagram showing the cross section of a substrate on which an interlayer insulating film is formed without the process of FIG. 1D after the substrate is processed with organic amine containing liquid. A conformal insulating film 31 is apparently formed similar to the conformal insulating film 31 shown in FIGS. 1E and 1F.

However, an insulating film 32 formed on the conformal insulating film 31 and having the planarizing function has a large difference of thickness at the positions over a substrate-contacted wiring pattern W1 and isolated wiring patterns W2 and W3. The insulating layer 32 does not exhibit a satisfactory planarizing function. If an overlying wiring layer is formed on this interlayer insulating film having large steps, some problems occur during photolithography and etching, making it difficult to form the overlying wiring layer with high precision.

Figure 2B:
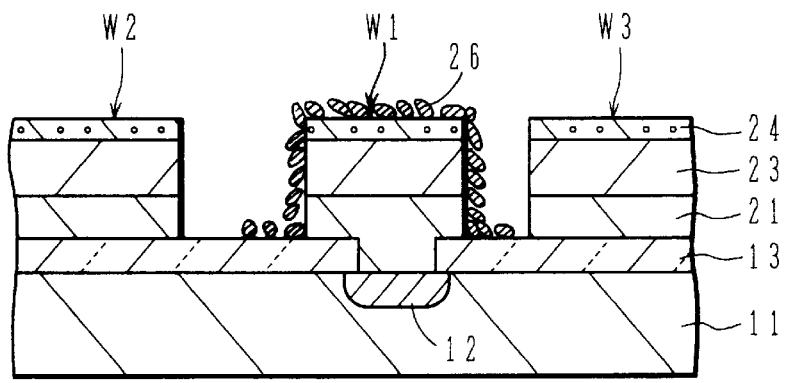

The present inventors have studied this phenomenon as in the following. FIG. 2B shows wiring patterns after the surfaces of the wiring pattern are processed with organic amine liquid. The substrate-contacted wiring pattern W1 has a surface potential which is different by about 0.5 V–50 V from that of the isolated wiring patterns W2 and W3. When deposition residues are dissolved into organic amine liquid, the deposition residues 26 are desorbed or detached once from the surfaces of the wiring patterns and insulating layer, and thereafter are selectively adsorbed or adhered to the surface of the substrate-contacted wiring pattern W1 because of the surface potential.

Figure 2C:
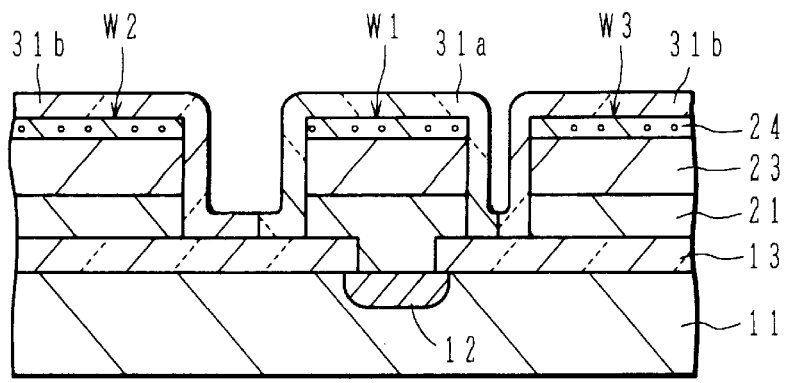

As shown in FIG. 2C, if a conformal insulating film 31 is deposited on the surface of the wiring pattern adhering the deposition residues 26, a conformal insulating layer 31a on the surface of the substrate-contacted wiring pattern W1 contains the compositions of the deposition residues 26 and is a layer different in nature from conformal insulating layers 31b on the surfaces of isolated wiring patterns W2 and W3.

If an insulating film 32 having the inherent planarizing function is formed on the conformal insulating films 31a and 31b, the deposition amount of the insulating layer 32 becomes different in accordance with a difference between the surfaces of the underlying layers. The surface steps of the interlayer insulating film shown in FIG. 2A may be considered as resulting from the deposition residues adhered to the surface of the substrate-contacted wiring pattern.

As shown in FIG. 1D, it can be supposed that as the surface of the substrate is processed with ammonium or hydrogen fluoride, the deposition residues 26 adhered to the surface of the substrate-contacted wiring pattern W1 are removed. Namely, fluoride ions or the like equalize the surface potentials of the substrate-contacted wiring pattern and isolated wiring patterns and etch several atomic layer on the wiring pattern surface so that the adhered deposition residues are dissolved and removed from the surface of the wiring pattern.

The above effects of fluoride ions may be obtained by a mixture gas of hydroxide ions, oxygen radicals, and oxygen ions. Similar effects to immersing a substrate into fluoric ion containing liquid may be obtained by immersing the substrate into choline or hydroxide containing liquid. Choline is sufficient if it is contained by an amount of 0.1 wt %–50 wt %. For example, a wiring layer is immersed in the liquid which contains choline by 10 wt %. A mixture gas of oxygen radicals and oxygen ions may be supplied from oxygen plasma. For example, in a diode parallel plasma CVD system, oxygen plasma can be generated in an oxygen atmosphere at 10 Torr or higher by applying an RF power of 0.5 W/cm2 to the upper parallel electrode.

The present invention has been described in connection with the preferred embodiments. The invention is not limited only to the above embodiments. It is apparent that various modifications, improvements, combinations, and the like can be made by those skilled in the art.

We claim:

1. A method of manufacturing a semiconductor device comprising the steps of:
    forming a wiring layer on a semiconductor substrate;
    forming a wiring pattern by dry etching the wiring layer using a resist pattern as a mask; immersing the wiring pattern in amine containing liquid to remove deposition residues formed during the dry etching;
    processing the wiring pattern having been immersed in the amine containing liquid with fluid not containing amine and containing ions or radicals which are capable of removing deposition residues;
    forming a conformal insulating layer on the processed wiring pattern; and
    forming an insulating layer having a planarizing function on the conformal insulating layer by CVD.

2. A method according to claim 1, wherein said step of forming the insulating film having the planarizing function includes the step of forming an insulating film by atmospheric pressure CVD.

3. A method according to claim 1, wherein the wiring layer comprises lamination of a barrier metal layer and a main wiring layer.

4. A method according to claim 3, wherein the wiring layer comprises an antireflection film laminated on the lamination.

5. A method according to claim 3, wherein the barrier metal layer is a TiN layer or a lamination of a Ti layer and a TiN layer formed on the Ti layer.

6. A method according to claim 3, wherein said main wiring layer includes one of a W layer, an Al—Cu alloy layer, an Al—Cu—Si alloy layer, and a lamination of a Cu layer and a TiN layer formed on the Cu layer.

7. A method according to claim 1, wherein the amine containing liquid contains one of primary, secondary and tertiary amines.

8. A method according to claim 1, wherein said step of processing the wiring pattern with fluid includes the step of immersing the wiring pattern in liquid which contains fluorine compound or choline.

9. A method according to claim 1, wherein said step of processing the wiring pattern with fluid includes the step of exposing the substrate in oxygen plasma.

10. A method according to claim 1, wherein the conformal insulating layer is lamination of a first layer and a second layer formed on the first layer, the first layer is denser than the second layer, and the second layer has a nature more excellent than the first layer as an underlying layer of the insulating film having the planarizing function.

11. A method according to claim 10, wherein the compositions of the first layer contain Si 25 at %–45 at %, O 30 at %–65 at %, N 0 at %–25 at %, H 0.01 at %–25 at %, Ar 0.001 at %–3 at %, F 0.001 at %–25 at %, B 0.001 at %–10 at %, P 0.001 at %–10 at %, and C 0.001 at %–50 at %.

12. A method according to claim 10, the compositions of the second layer contain Si 25 at %–35 at % or Si 45 at %–55 at %, O 45 at %–70 at % or O 5 at %–25 at %, N 0.0001 at %–3.0 at %, or N 15 at %–30 at %, H 0.0001 at %–5 at % or H 10.0 at %–25 at %, respectively, and Ar 0.0001 at %–3 at %, F 0.0001 at %–15 at %, P 0.0001 at %–10 at %, and C 0.0001 at %–2 at %.

13. A method according to claim 1, wherein first source gas used in said step of forming the conformal insulating film is one or a combination of two to five materials selected from the group consisting of $SiH_4$, $Si_2H_6$, $Si(OC-R)_4$, $HSi(OC-R)_3$, $SiF_4$, $SiH_2F_2$, $C_2F_6$, $FSi(OC-R)_3$, $F_2Si(OC-R)_2$, $R-PH_2$, $R_2-PH$, $B_2H_6$, $P(O-R)_3$, $PO(O-R)_3R_3-B$, $R_2-BH$, $R-BH_2$, $B(O-R)_3$, $BF_3$, $FB(O-R)_2$, $F_2B(O-R)$, where R is alcoxyl, and second source gas is one or a combination of two to five materials selected from the group consisting of $N_2O$, $O_2$, $O_3$, O, $F_2$, $NH_3$, rare gases, and $N_2$.

14. A method according to claim 1, wherein the compositions of the insulating film having the planarizing function contain Si 25 at %–45 at %, O 30 at %–65 at %, N 0.001 at %–25 at %, H 0.001 at %–25 at %, Ar 0.001 at %–3 at %, F 0.001 at %–25 at %, B 0.001 at %–10 at %, P 0.001 at %–10 at %, and C 0.001 at %–50 at %.

15. A method according to claim 14, wherein first source gas used in said step of forming the insulating film having the planarizing function is one or a combination of two or three materials selected from the group consisting of $SiH_4$, $Si_2H_6$, $Si(OC-R)_4$, $HSi(OC-R)_3$, $SiF_4$, $SiH_2F_2$, $C_2F_6$, $FSi(OC-R)_3$, $F_2Si(OC-R)_2$, $R-PH_2$, $R_2-PH$, $B_2H_6$, $P(O-R)_3$, $PO(O-R)_3-R_3-B$, $R_2-BH$, $R-BH_2$, $B(O-R)_3$, $BF_3$, $FB(O-R)_2$, $F_2B(O-R)$, where R is alcoxyl, and second source gas used is one or a combination of two or three materials selected from the group consisting of $O_2$, $O_3$, O, rare gas, and $N_2$.

16. A method of manufacturing a semiconductor device comprising the steps of:
    forming a wiring layer on a semiconductor substrate;
    forming a wiring pattern by dry etching the wiring layer using a resist pattern as a mask;
    immersing the wiring pattern in amine containing liquid to remove deposition residues formed during the dry etching;
    processing the wiring pattern having been immersed in the amine containing liquid with fluid containing at least one from the group consisting of fluoride ion, hydroxide ion, oxygen radical, oxygen ion, and choline but not containing amine and being capable of removing deposition residues;

forming a conformal insulating layer on the processed wiring pattern; and forming an insulating layer having a planarizing function on the conformal insulating layer by CVD.

17. A method of manufacturing a semiconductor device comprising the steps of:

forming a wiring layer on a semiconductor substrate, the wiring layer comprising lamination of a barrier metal layer and a main wiring layer;

forming a wiring pattern by dry etching the wiring layer using a resist pattern as a mask;

immersing the wiring pattern in amine containing liquid to remove deposition residues formed during the dry etching;

processing the wiring pattern having been immersed in the amine containing liquid with fluid not containing amine and being capable of removing deposition residues;

forming a conformal insulating layer on the processed wiring pattern; and forming an insulating layer having a planarizing function on the conformal insulating layer by CVD.

18. A method according to claim 17, wherein the wiring layer comprises an antireflection film laminated on the lamination.

19. A method according to claim 17, wherein the barrier metal layer is a TiN layer or a lamination of a Ti layer and a TiN layer formed on the Ti layer.

20. A method according to claim 17, wherein said main wiring layer includes one of a W layer, an Al—Cu alloy layer, an Al—Cu—Si alloy layer, and a lamination of a Cu layer and a TiN layer formed on the Cu layer.

21. A method of manufacturing a semiconductor device comprising the steps of:

forming a wiring layer on a semiconductor substrate;

forming a wiring pattern by dry etching the wiring layer using a resist pattern as a mask;

immersing the wiring pattern in amine containing liquid to remove deposition residues formed during the dry etching;

processing the wiring pattern having been immersed in the amine containing liquid with fluid not containing amine and being capable of removing deposition residues, said processing including a step of immersing the wiring pattern in liquid which contains fluorine compound or choline;

forming a conformal insulating layer on the processed wiring pattern; and forming an insulating layer having a planarizing function on the conformal insulating layer by CVD.

22. A method of manufacturing a semiconductor device comprising the steps of:

forming a wiring layer on a semiconductor substrate;

forming a wiring pattern by dry etching the wiring layer using a resist pattern as a mask;

immersing the wiring pattern in amine containing liquid to remove deposition residues formed during the dry etching;

processing the wiring pattern having been immersed in the amine containing liquid with fluid not containing amine and being capable of removing deposition residues, said processing including a step of exposing the substrate in oxygen plasma;

forming a conformal insulating layer on the processed wiring pattern; and forming an insulating layer having a planarizing function on the conformal insulating layer by CVD.

* * * * *